(12) United States Patent
Ikeda et al.

(10) Patent No.: US 8,691,481 B2
(45) Date of Patent: Apr. 8, 2014

(54) LOCAL EXPOSURE METHOD AND LOCAL EXPOSURE APPARATUS

(75) Inventors: Fumihiko Ikeda, Kumamoto (JP); Hikaru Kubota, Kumamoto (JP); Koutarou Onoue, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 13/326,603

(22) Filed: Dec. 15, 2011

(65) Prior Publication Data

US 2012/0164585 A1 Jun. 28, 2012

(30) Foreign Application Priority Data

Dec. 22, 2010 (JP) .................................. 2010-285641

(51) Int. Cl.
*G03F 7/20* (2006.01)
(52) U.S. Cl.
USPC .............................................. 430/30; 355/67
(58) Field of Classification Search
USPC .............................................. 430/30; 355/67
See application file for complete search history.

(56) References Cited

U.S. PATENT DOCUMENTS 7,643,126 B2 * 1/2010 Tanaka et al. ................... 355/53
2009/0317728 A1 * 12/2009 Oh et al. ............................ 430/5

FOREIGN PATENT DOCUMENTS

JP 2007-158253 6/2007

* cited by examiner

*Primary Examiner* — Daborah Chacko Davis
(74) *Attorney, Agent, or Firm* — Posz Law Group, PLC

(57) ABSTRACT

A local exposure method includes steps of: dividing a large block into a plurality of small blocks; setting irradiation illuminances different in a stepwise fashion; controlling light emission of light emitting elements based on the irradiation illuminances respectively set for the small blocks for a photosensitive film on a substrate moving with respect to light emitting elements; developing the photosensitive film having been subjected to exposure processing by irradiation by the light emitting elements; measuring a residual film thickness of the photosensitive film for each of the small blocks to obtain correlation data between the illuminance set for the small block and the residual film thickness; and obtaining a required illuminance of irradiation to each of the large blocks from a target residual film thickness of the photosensitive film set for each of the large blocks based on the correlation data.

8 Claims, 13 Drawing Sheets

FIG.8

| FILM THICKNESS | LARGE BLOCK | REQUIRED REDUCED FILM THICKNESS | REQUIRED ILLUMINANCE | LIGHT EMISSION CONTROL GROUP | FORWARD CURRENT VALUE |
|---|---|---|---|---|---|
| 7500Å | (x1, y1) | 0Å | 0mJ/cm² | GR₅ | 0mA |
|  | (x2, y1) | 1000Å | 4mJ/cm² | GR₅ | 7.5mA |
|  | (x3, y1) | 500Å | 2mJ/cm² | GR₅ | 4.1mA |
|  | ... | ... | ... | ... | ... |
| 8000Å |  |  |  |  |  |
|  | ... | ... | ... | ... | ... |

T

LOCAL EXPOSURE METHOD AND LOCAL EXPOSURE APPARATUS

BACKGROUND OF THE INVENTION

1. Field of the Invention

The present invention relates to a local exposure method and a local exposure apparatus locally performing exposure processing to a substrate having a photosensitive film formed thereon.

2. Description of the Related Art

In manufacture of, for example, an FPD (Flat Panel Display), a circuit pattern is formed by a so-called photolithography process.

In the photolithography process, a predetermined film is formed on a substrate such as a glass substrate, then a photoresist (hereinafter, called resist) is applied, and preliminary drying processing (reduced-pressure drying and pre-baking processing) vaporizing the solvent in the resist is performed to form a resist film (photosensitive film) as described also in Japanese Laid-open Patent Publication No. 2007-158253. Then, the resist film is exposed according to the circuit pattern and subjected to developing treatment to form a pattern.

In such a photolithography process, it is possible to provide different film thicknesses (a thick film portion R1 and a thin film portion R2) in a resist pattern R as illustrated in FIG. 10A and perform etching treatment a plurality of times using the resist pattern R, thereby reducing the number of photomasks and the number of process steps. Note that such a resist pattern R can be obtained by half (halftone) exposure processing using one halftone mask having portions different in light transmittance.

A circuit pattern forming process when using the resist pattern R to which the half exposure has been applied will be concretely described using FIG. 10A to FIG. 10E.

For example, a gate electrode 200, an insulating layer 201, a Si layer 202 composed of an a-Si layer (non-doped amorphous Si layer) 202a and an n+a-Si layer 202b (phosphor doped amorphous Si layer), and a metal layer 203 for forming an electrode are layered in order on a glass substrate G in FIG. 10A.

Further, a resist film is uniformly formed on the metal layer 203, then the solvent in the resist is vaporized by reduced-pressure drying and pre-baking processing, and then the half exposure processing and developing treatment are performed, whereby a resist pattern R is formed.

After the formation of the resist pattern R (the thick film portion R1 and the thin film portion R2), the metal layer 203 is etched (first etching) is performed using the resist pattern R as a mask as illustrated in FIG. 10B.

Then, ashing processing is performed in plasma to the whole resist pattern R. This forms resist patterns R3 having a film thickness reduced to about half as illustrated in FIG. 10C.

Then, as illustrated in FIG. 10D, etching (second etching) is performed on the exposed metal layer 203 and the Si layer 202 using the resist patterns R3 as a mask, and the resist patterns R3 are finally removed at last as illustrated in FIG. 10E, whereby a circuit pattern is obtained.

However, the half exposure processing using the resist pattern R in which the thick film portion R1 and the thin film portion R2 are formed as described above has a problem. The problem is that when the resist pattern R is formed and its film thickness is ununiform within the substrate, the line width of the pattern to be formed and the pitch between the patterns vary.

Concretely describing the problem using FIG. 11A to FIG. 11E, FIG. 11A illustrates the case where the thin film portion R2 in the resist pattern R is formed such that a thickness t2 thereof is larger than a thickness t1 illustrated in FIG. 10A.

In this case, etching of the metal layer 203 (FIG. 11B) and ashing processing to the whole resist pattern R (FIG. 11C) are performed as in the process illustrated in FIG. 10.

Here, the resist patterns R3 having a film thickness reduced to about half are obtained as illustrated in FIG. 11C, but the thickness of the resist film to be removed is the same as that in the case of FIG. 10C, so that a pitch p2 between a pair of resist patterns R3 illustrated is narrower than a pitch p1 illustrated in FIG. 10C.

Accordingly, the pitch p2 of a circuit pattern obtained through the etching to the metal film 203 and the Si layer 202 (FIG. 11D) and removal of the resist patterns R3 (FIG. 11E) from that state is narrower than the pitch p1 illustrated in FIG. 10E (the line width of the circuit pattern is wider).

To the above problem, means is conventionally taken which specifies a predetermined part in the resist pattern R formed thicker than a desired value by film thickness measurement for each mask pattern through which light is transmitted at exposure processing, and increases the exposure sensitivity at the part.

In the pre-baking processing of heating the resist film before exposure processing to vaporize the solvent, difference is provided in heating amount within the substrate to vary the exposure sensitivity at the predetermined part to thereby adjust a residual film thickness after developing treatment (made uniform within the plane).

Concretely, a heater used for the pre-baking processing is divided into a plurality of areas and the divided heater is independently controlled in drive to thereby perform temperature adjustment for each area.

Further, the heating temperature is adjusted by changing the heights of proximity pins supporting the substrate (changing the distance between the heater and the substrate).

SUMMARY OF THE INVENTION

However, when adjusting the residual film thickness by the heat processing by the pre-baking as described above, it is necessary to secure a certain size for the area of divided heater in terms of restriction of hardware and has a problem that heating adjustment for small areas is impossible.

Further, in the heating adjustment by the heights of the proximity pins requires an operation step of changing the pin heights and therefore has a problem of a reduction in productivity.

The present invention is made in consideration of the problems in the prior art as described above, and an object thereof is to make it possible easily adjust the exposure amount for each area finely set within a surface to be treated of a substrate, improve the uniformity of a resist residual film thickness after developing treatment, and suppress variation in line width and pitch of a wiring pattern.

To solve the above problem, the local exposure method according to the present invention is a local exposure method of locally performing exposure processing by dividing a photosensitive film formed on a substrate into a plurality of large blocks, relatively moving the substrate below a plurality of light emitting elements arranged in a line shape and in a direction intersecting with an arrangement direction of the light emitting elements, and selectively controlling light emission of the plurality of light emitting elements based on an illuminance set in advance for each of the large blocks, the local exposure method including the steps of: dividing the large block into a plurality of small blocks; setting irradiation illuminances different in a stepwise fashion for the small blocks in the large block respectively; controlling light emission of the light emitting elements based on the irradiation illuminances respectively set for the small blocks for the photosensitive film on the substrate moving with respect to the plurality of light emitting elements; developing the photosensitive film which has been subjected to exposure processing by irradiation by the light emitting elements; measuring a residual film thickness of the photosensitive film for each of the small blocks which have been subjected to the developing treatment to obtain correlation data between the illuminance set for the small block and the residual film thickness; and obtaining a required illuminance of irradiation to each of the large blocks from a target residual film thickness of the photosensitive film set for each of the large blocks based on the correlation data.

Further, to solve the above problem, the local exposure method according to the present invention is a local exposure method of locally performing exposure processing by dividing a photosensitive film formed on a substrate into a plurality of large blocks, relatively moving the substrate below a plurality of light emitting elements arranged in a line shape and in a direction intersecting with an arrangement direction of the light emitting elements, and selectively controlling light emission of the plurality of light emitting elements based on an illuminance set in advance for each of the large blocks, the local exposure method including the steps of: dividing the large block into a plurality of small blocks; setting irradiation illuminances different in a stepwise fashion for the small blocks in the large block respectively; controlling light emission of the light emitting elements based on the irradiation illuminances respectively set for the small blocks for the photosensitive film on the substrate moving with respect to the plurality of light emitting elements; developing the photosensitive film which has been subjected to exposure processing by irradiation by the light emitting elements; measuring a line width after the development of the photosensitive film for each of the small blocks which have been subjected to the developing treatment to obtain correlation data between the illuminance set for the small block and the line width; and obtaining a required illuminance of irradiation to each of the large blocks from a target line width of the photosensitive film set for each of the large blocks based on the correlation data.

Further, the present invention in another aspect is a local exposure apparatus locally performing exposure processing to a substrate having a photosensitive film formed thereon, the local exposure apparatus including: a plurality of light emitting elements arranged in a line shape; a moving means for relatively moving the substrate below the plurality of light emitting elements and in a direction intersecting with an arrangement direction of the light emitting elements; and a control unit selectively controlling light emission of the plurality of light emitting elements, wherein the control unit divides the photosensitive film formed on the substrate into a plurality of large blocks and selectively controls light emission of the plurality of light emitting elements based on an illuminance set in advance for each of the large blocks.

According to the present invention, it is possible to easily adjust the exposure amount for each area finely set within a surface to be treated of a substrate to improve the uniformity of a resist residual film after developing treatment and suppress variations in line width and pitch of a wiring pattern.

BRIEF DESCRIPTION OF THE DRAWINGS

FIG. 8 is a table representing an example of a recipe used in the local exposure method according to this embodiment;

DETAILED DESCRIPTION OF THE INVENTION

Figure 1:
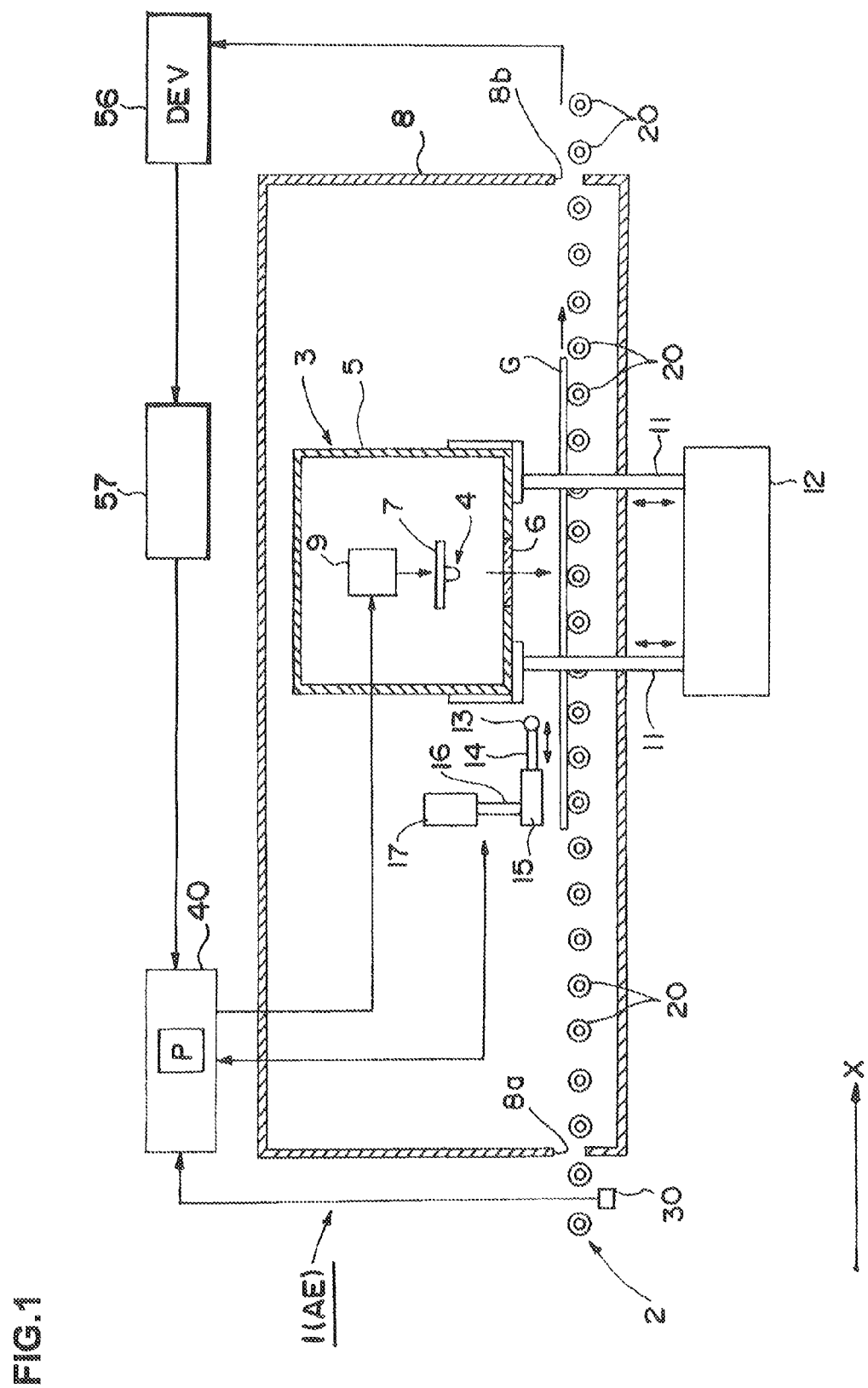
FIG. 1 is a sectional view illustrating a whole schematic configuration of an embodiment.
Figure 2:
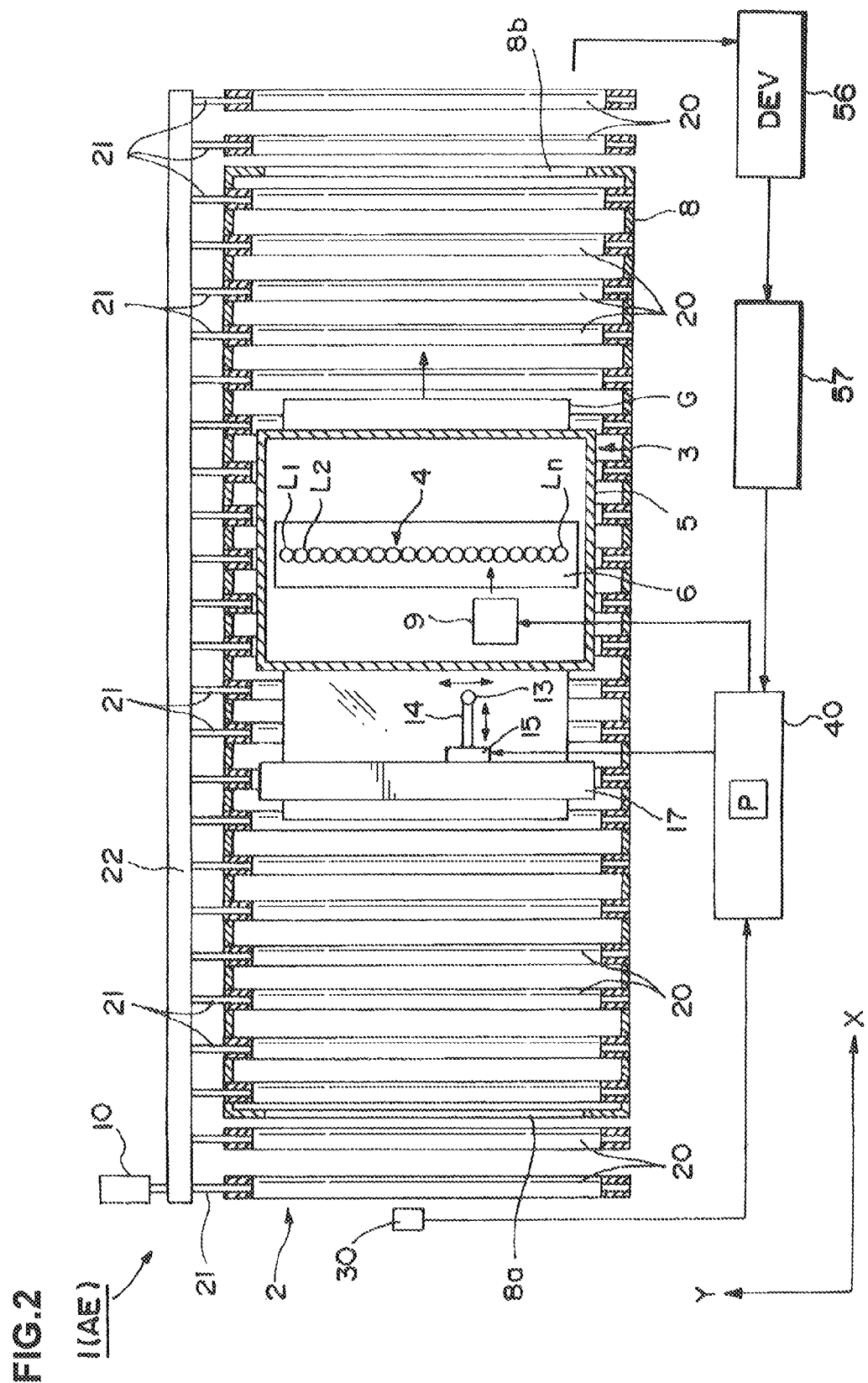
FIG. 2 is a plan view illustrating a whole schematic configuration of an embodiment.

Hereinafter, an embodiment (a first embodiment) relating to a local exposure method and a local exposure apparatus of the present invention will be described based on the drawings. FIG. 1 is a sectional view illustrating a schematic configuration of a local exposure apparatus 1 according to this embodiment, and FIG. 2 is a plan view thereof. Further, FIG. 3 is a diagram schematically illustrating an arrangement of the local exposure apparatus 1 (AE) in a photolithography process.

The local exposure apparatus 1 (AE) illustrated in FIG. 1, FIG. 2 is placed in a unit which performs a series of photolithography process while horizontally transferring a substrate in an X-direction (hereinafter, described as "horizontal transfer") with the substrate being in a horizontal state as illustrated, for example, in FIG. 3. More specifically, in the photolithography process, a resist coating apparatus 51 (CT) applying a resist solution forming a photosensitive film on the substrate, and a reduced-pressure drying apparatus 52 (DP) drying a resist film (photosensitive film) on the substrate in a chamber at reduced pressure are arranged. Further, a pre-baking apparatus 53 (PRB) performing heat processing for fixing the resist film on a substrate G, a cooling apparatus 54 (COL) cooling the resist film to a predetermined temperature, an exposure apparatus 55 (EXP) exposing the resist film into a predetermined circuit pattern, and a developing apparatus 56 (DEV) developing the resist film after exposure are arranged in order.

Figure 3:
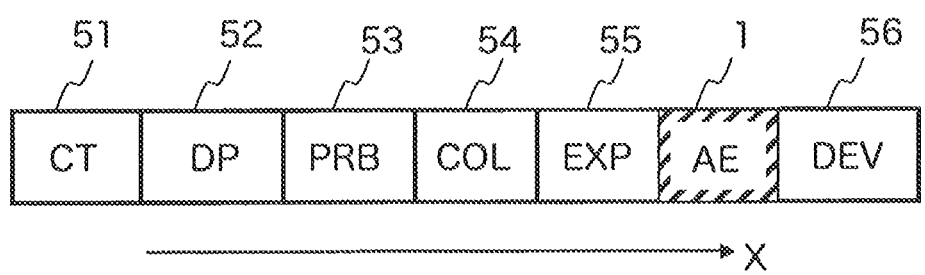
FIG. 3 is a diagram schematically illustrating an arrangement of a local exposure apparatus in a photolithography process.

Here, the local exposure apparatus 1 (AE) according to this embodiment is placed at a stage subsequent to the exposure apparatus 55 (EXP) performing exposure processing to the entire substrate, for example, as illustrated in FIG. 3.

In the local exposure apparatus 1 placed as described above, for example, in the case of using a positive resist and successively processing a plurality of substrates G, when a wiring pattern width is larger and a pitch between patterns is smaller in a predetermined region than in other regions in every substrate G, local exposure is performed to the predetermined region (for reducing the film thickness).

Note that the case of the positive resist will be described as an example in the following embodiment, but the local exposure method according to the present invention is applicable also to the case of a negative resist, in which case local exposure is performed to a predetermined region where the resist film thickness is desired to be left larger.

The configuration of the local exposure apparatus 1 (AE) will be described in detail. As illustrated in FIG. 1, FIG. 2, the local exposure apparatus 1 (AE) includes a substrate transfer path 2 as a moving means transferring the substrate G in the X-direction by means of a plurality of rollers rotatably laid.

The substrate transfer path 2 has a plurality of cylindrical rollers 20 extending in a Y-direction as illustrated in FIG. 2, and the plurality of rollers 20 are rotatably arranged at predetermined intervals between them in the X-direction. Further, the plurality of rollers 20 are provided so that rotations of their rotation shafts 21 can be interlocked by a belt 22, and one of the rotation shafts 21 is connected to a roller drive apparatus 10 such as a motor or the like.

Further, the local exposure apparatus 1 (AE) includes a box-shaped chamber 8 covering the surrounding of the substrate transfer path 2 and for forming an exposure processing space for the substrate G.

As illustrated, a transfer-in port 8a in a slit shape extending in the Y-direction is provided in a front side wall of the chamber 8. The substrate G on the substrate transfer path 2 passes through the transfer-in port 8a and is transferred into the chamber 8.

Further, a transfer-out port 8b in a slit shape extending in the Y-direction through which the substrate G on the substrate transfer path 2 can pass is provided in a rear side wall of the chamber 8. Specifically, the substrate G on the substrate transfer path 2 passes through the transfer-out port 8b and is transferred out of the chamber 8.

Further, as illustrated, a light irradiator 3 for performing local exposure (UV light irradiation) for the substrate G is placed above the substrate transfer path 2 in the chamber 8.

The light irradiator 3 includes a casing 5 accommodating a light source 4 in a shield space, and a light radiation window 6 composed of a light diffusing plate is provided at the lower surface of the casing 5. In other words, the light radiation window 6 is located between the light source 4 and the substrate G being a body to be irradiated.

The light source 4 accommodated in the casing 5 is a line-shaped light source 4 provided extending in a substrate width direction (Y-direction), and the line-shaped light source 4 is configured such that a plurality of UV-LED elements L1 to Ln (n is a positive integer) each emitting UV light at a predetermined wavelength (close to any one of, for example, g-ray (436 nm), h-ray (405 nm), i-ray (364 nm)) are linearly arranged on a circuit board 7.

Since the light radiated from the light source 4 is moderately diffused by the light radiation window 6, the lights of the adjacent UV-LED elements L couple together in a line shape and applied downward.

Further, light emission drive of each of the UV-LED elements L constituting the light source 4 is independently controlled by a light emission drive part 9. Further, the value of forward current supplied to each UV-LED element L can be controlled. In other words, the irradiance of light emission of each UV-LED element L according to the supply current is variable by the light emission drive part 9.

Further, in normal exposure processing, a plurality of (for example, five) adjacent UV-LED elements L are set as one group (called a light emission control group GR), and controlled in light emission by the light emission drive part 9 per unit of the group.

Note that drive of the light emission drive part 9 is controlled by a control unit 40 composed of a computer.

Further, as illustrated in FIG. 1, the light irradiator 3 is supported from below by raising and lowering shafts 11, and the raising and lowering shafts 11 are provided to be movable up and down, for example, by a ball screw type structure by means of a raising and lowering drive part 12 composed of a motor or the like. In other words, the irradiation position of the light irradiator 3 is variable with respect to the substrate G transferred on the substrate transfer path 2. The raising and lowering drive part 12 is controlled by the control unit 40.

Further, in the chamber 8, an illuminance sensor 13 for detecting the illuminance (radiant flux) of the light radiated from the light source 4 and passing through the light radiation window 6 is provided beside the light irradiator 3 (on the upstream side in the drawing). The illuminance sensor 13 is provided at the tip of a forward/backward shaft 14 capable of moving forward and backward from the side to a position below the light radiation window 6, and a forward/backward drive part 15 of the forward/backward shaft 14 is suspended by a support shaft 16. The support shaft 16 is provided to be movable in the substrate width direction (Y-direction) by means of a horizontal movement drive part 17, so that the illuminance sensor 13 can detect the illuminance at an arbitrary position below the light radiation window 6.

Note that a signal detected by the illuminance sensor 13 is supplied to the control unit 40 composed of a computer. Further, the forward/backward drive part 15 and the horizontal movement drive part 17 are controlled by the control unit 40.

Further, in the local exposure apparatus 1, a substrate detection sensor 30 for detecting a predetermined portion (for example, the tip) of the substrate G transferred on the substrate transfer path 2 is provided, for example, on the upstream side of the transfer-in port 8a of the chamber 8 so that its detection signal is outputted to the control unit 40. Since the substrate G is transferred on the substrate transfer path 2 at a predetermined speed (for example, 50 mm/sec), the control unit 40 can acquire the transfer position of the substrate G from the detection signal, the time after acquisition of the detection signal, and the substrate transfer speed.

Further, the control unit 40 has, in a predetermined storage area, a light emission control program P for controlling the luminance of each of the UV-LED elements L constituting the light source 4, namely, the value of current supplied to each element L at a predetermined timing.

In the light emission control program P, the required illuminance to be radiated to a predetermined position on the substrate G (the value of current to be supplied to a light emission control group GR), information specifying the light emission control group GR to be controlled in light emission to the predetermined position of the substrate G and so on are set in advance as parameters of a recipe used in execution thereof.

Here, a series of operations in a process (called a measurement mode) for obtaining recipe contents (parameters) stored in the control unit 40 and in a normal local exposure process which are executed in the local exposure apparatus 1 will be described using FIG. 4.

Note that in the measurement mode, the local exposure apparatus 1, the developing apparatus 56 (DEV), and a film thickness measurement apparatus 57 work in cooperation with each other as illustrated in FIG. 1, FIG. 2. Further, steps surrounded by broken lines in the flow of FIG. 4 represent treatment contents outside the local exposure apparatus 1.

Figure 4:
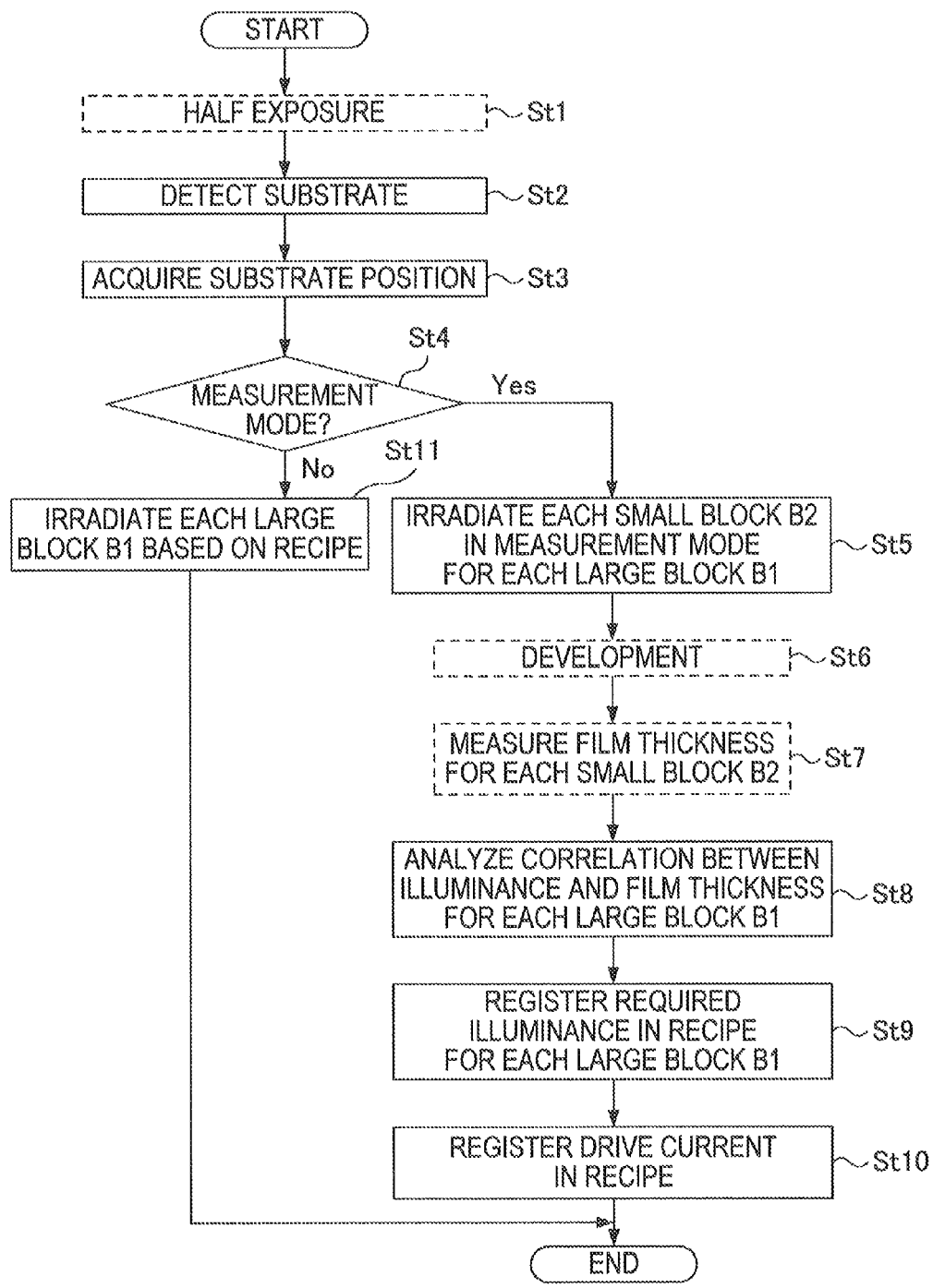
FIG. 4 is a flow illustrating a process of setting recipe contents and a process of normal local exposure processing in a local exposure method according to this embodiment.

First, the substrate G on which the resist film is formed is transferred into the exposure apparatus 55 (EXP) and subjected to exposure processing (half exposure processing) with a predetermined mask pattern (Step St1 in FIG. 4).

After the exposure processing at Step St1, the substrate G is transferred on the substrate transfer path 2 in the local exposure apparatus 1 and detected by the substrate detection sensor 30, and the substrate detection signal is then supplied to the control unit 40 (Step St2 in FIG. 4).

The control unit 40 starts to acquire (detect) the transfer position of the substrate G based on the substrate detection signal and the substrate transfer speed (Step St3 in FIG. 4).

Here, when the recipe contents (parameters) have not been set yet, the control unit 40 conducts a control to implement the measurement mode for setting the recipe contents (Step St4 in FIG. 4).

Figure 5:
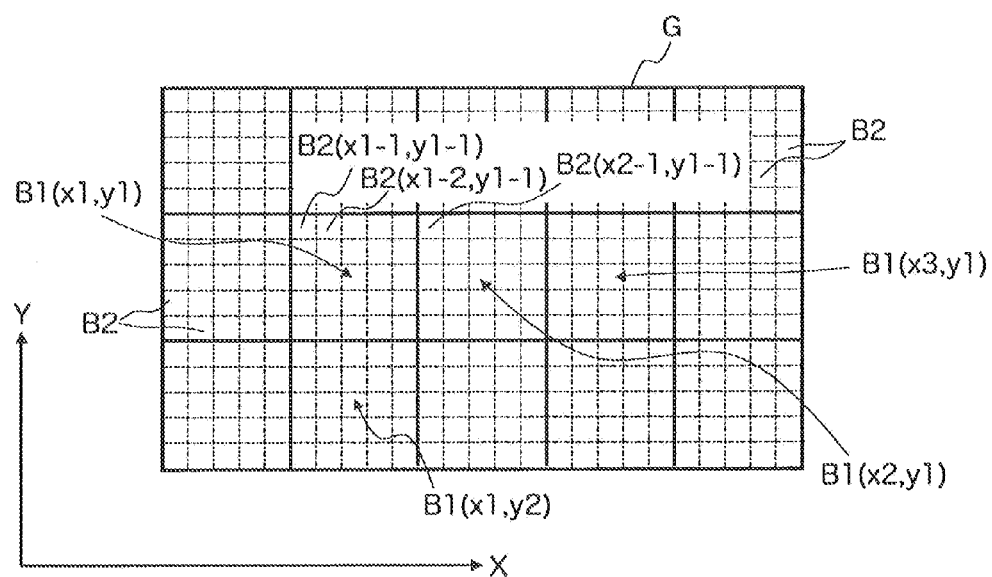
FIG. 5 is a plan view of a substrate representing an image of virtually dividing a substrate surface into a plurality of large blocks and small blocks in the local exposure method according to this embodiment.
Figure 6:
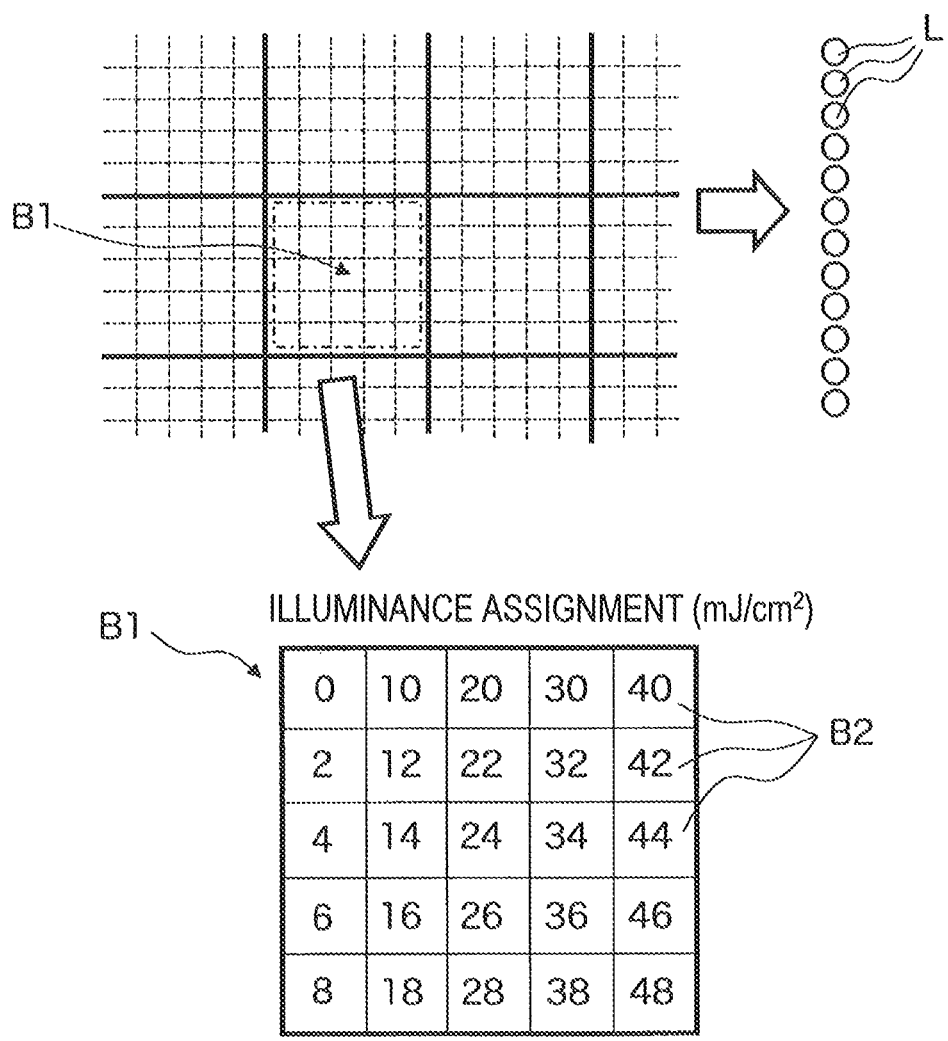
FIG. 6 is a plan view illustrating a setting example of illuminances assigned to the small blocks in FIG. 5.
Figure 7:
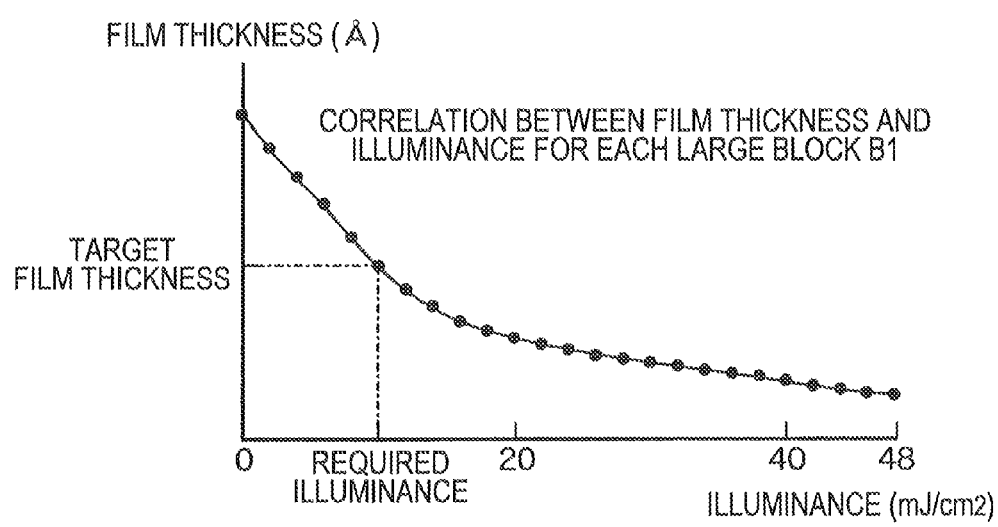
FIG. 7 is a graph made by plotting the film thicknesses after developing treatment to the illuminances assigned to the small blocks in FIG. 6.

The measurement mode will be concretely described using FIG. 5 to FIG. 7.

In the measurement mode, a surface to be treated (photosensitive film surface) of the substrate G is virtually divided into a plurality of large blocks B1 (areas partitioned by heavy lines), and an area in each large block B1 is further virtually divided into a plurality of (for example, 25) small blocks B2 (areas partitioned by chain lines) as illustrated in FIG. 5.

The control unit 40 identifies each large block B1 by coordinate values (for example, B1(x1, y1), B1(x2, y1) or the like), and identifies each small block B2 by coordinate values (for example, B2(x1−1, y1−1)) determined in the large block B1.

The large block B1 is a minimum unit area for film thickness management (an area in which the target film thickness is the same), and when not the measurement mode but the normal local exposure process is performed, irradiation is performed at a uniform illuminance within the area.

Further, the small block B2 is a minimum unit area for irradiation control in the measurement mode, and the illuminance at which irradiation is performed for each small block B2 in the measurement mode is set different from the illuminances at which irradiation is performed for other small blocks B2.

Specifically, numbers different at predetermined distances in a range of 0 to 48 mJ/cm$^2$ are assigned to the small blocks B2 in each large block B1 as illustrated in FIG. 6. In FIG. 6, different illuminances are assigned to 25 small blocks B2, respectively. Thus, the exposure amounts to the small blocks B2 become different according to the illuminances so that differences according to the illuminances are generated in the film thickness after developing treatment.

The reason why irradiation is performed at different illuminances to the plurality of small blocks B2 in the measurement mode is to obtain an optimal illuminance (hereinafter, referred to as a required illuminance) for bringing the film thickness after developing treatment to a desired value (target film thickness) for each large block B1. In short it is only necessary to select a small block B2 where the residual film thickness becomes consistent with the target film thickness after developing treatment in the measurement mode and regard the illuminance at which irradiation is performed to the small block B2 as the required illuminance.

Further, the size of each small block B2 is made to correspond to the irradiation area by one UV-LED element L in this embodiment, and the light emission control of each UV-LED element L is independently performed in the measurement mode, whereby irradiation at the set illuminance illustrated in FIG. 6 is performed to each small block B2. In the case of performing irradiation by the light emission control of one UV-LED element L to one small block B2, it is possible to set most small blocks B2 on the substrate surface to increase the accuracy of the required illuminance and improve the uniformity in film thickness.

Therefore, the control unit 40 controls the light emission drive part 9 so that when the substrate G is transferred below the light irradiator 3, each UV-LED element L irradiates each small block B2 passing below each UV-LED element L at the set illuminance illustrated in FIG. 6 in the measurement mode (Step St5 in FIG. 4).

Here, the substrate G through the exposure processing at Step St5 is transferred into the developing apparatus 56 (DEV) and subjected to developing treatment (Step St6 in FIG. 4).

Then, the developed substrate G is transferred into the film thickness measurement apparatus 57 in which the residual film thickness of the resist film is measured for each small block B2 in each large block B1 (Step St7 in FIG. 4). By this measurement, a correlation graph (correlation data) between the residual film thickness and the illuminance as illustrated in FIG. 7 is obtained for each large block B1 (Step St8 in FIG. 4).

Specifically, FIG. 7 is an example of the correlation graph made by plotting the residual film thickness in the small block B2 corresponding to each illuminance (0, 2, 4, . . . , 48 mJ/cm$^2$) with the illuminance (0 to 48 mJ/cm$^2$) on the horizontal axis and the residual film thickness (Å) on the longitudinal axis.

The correlation data on each large block B1 illustrated as a graph in FIG. 7 is fed back to the control unit 40 and stored in its storage means (not illustrated) as a correlation table.

Further, in a recipe table T in FIG. 8 stored in the control unit 40, target film thickness values (for example, 7500 Å for the large block B1(x1, y1), 8000 Å for the large block B1(x3, y1)) for all of the large blocks B1 are set in advance respectively, and the control unit 40 compare the target film thicknesses to the correlation data to thereby obtain appropriate required illuminances for all of the large blocks B1.

Then, after obtaining the required illuminances for all of the large blocks B1, the control unit 40 registers the illuminances in the recipe table T (Step St9 in FIG. 4). In the example in FIG. 8, 0 mJ/cm² (namely, correction irradiation is unnecessary) is registered for the large block B1(x1, y1), and 2 mJ/cm² is registered for the large block B1(x3, y1).

Further, the control unit 40 sets a plurality of (five in the drawing) UV-LED elements L corresponding to irradiation to each large block B1, as a light emission control group GR, obtains the required forward current value for causing each light emission control group GR to emit light at the required illuminance, and registers the required forward current value in the recipe table T. In the example of FIG. 8, the large block B1(x1, y1) corresponds to a light emission control group GR5 for which a current value of 0 mA is set, and the large block B1(x3, y1) corresponds to the light emission control group GR5 for which a current value of 4.1 mA is set.

In measurement of the forward current value, the light irradiator 3 is moved up to a predetermined height by the raising and lowering drive part 12, and the illuminance sensor 13 is moved to a position below the light radiation window 6 by the forward/backward drive part 15 and the horizontal movement drive part 17. Here, the distance between the light radiation window 6 and the illuminance sensor 13 is adjusted to be equal to the distance between the light radiation window 6 and the upper surface of the substrate G, and the light emission illuminance of each control group GR as a light emission control unit is detected by the illuminance sensor 13. Then, when the value of the illuminance detected by the illuminance sensor 13 reaches the illuminance at which the light emission control group GR should emit light, the supply current at that time is measured and registered in the recipe table T as a drive current value (Step St10 in FIG. 4).

On the other hand, when the recipe contents have been already set at step St4 in FIG. 4, the control unit 40 performs light emission control of the UV-LED elements L based on the recipe table T as the normal local exposure process (Step St11 in FIG. 4).

Figure 9:
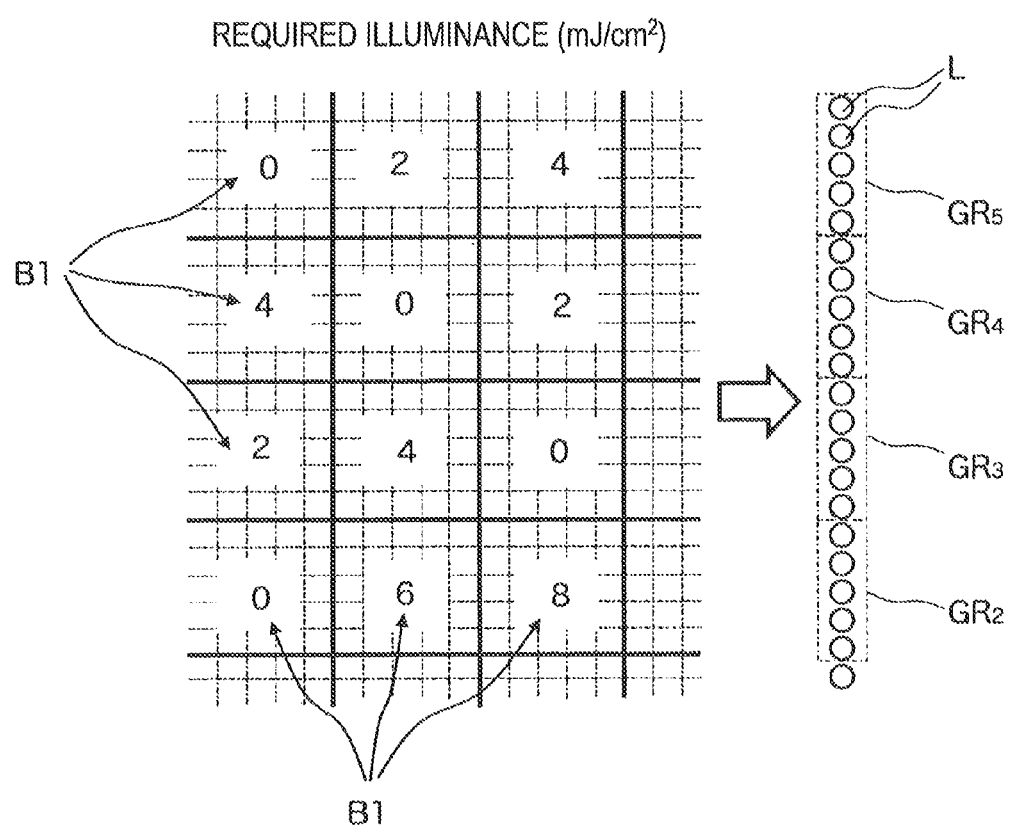
FIG. 9 is a plan view illustrating an example of required illuminances set to the large blocks in FIG. 5 in local exposure performed by the local exposure method according to this embodiment.
Figure 10A:
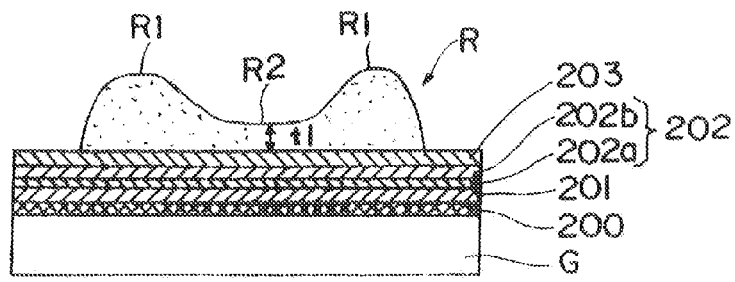
FIG. 10A is a sectional view for explaining a wiring pattern forming process using half exposure processing, illustrating an appearance that a resist pattern is formed on a metal layer.
Figure 10B:
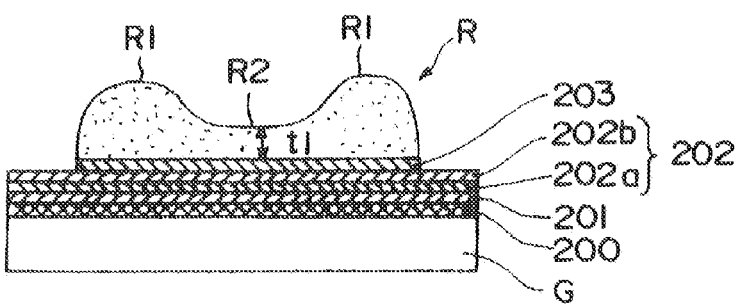
FIG. 10B illustrates an appearance that the metal layer is etched using the resist pattern as a mask in FIG. 10A.
Figure 10C:
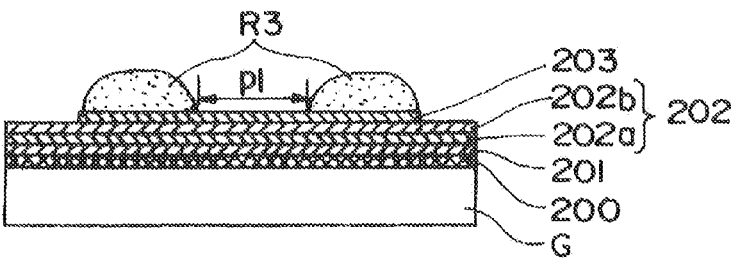
FIG. 10C illustrates an appearance that the film thickness of the resist pattern is reduced in FIG. 10B.
Figure 10D:
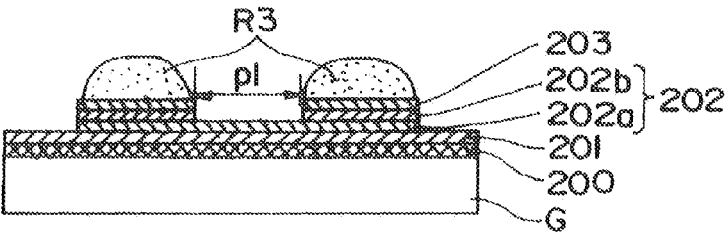
FIG. 10D illustrates an appearance that the metal layer and a Si layer are etched using the resist pattern as a mask in FIG. 10C.
Figure 10E:
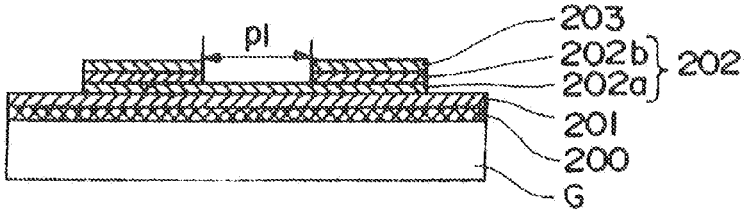
FIG. 10E illustrates an appearance that the resist pattern is removed in FIG. 10D.
Figure 11A:
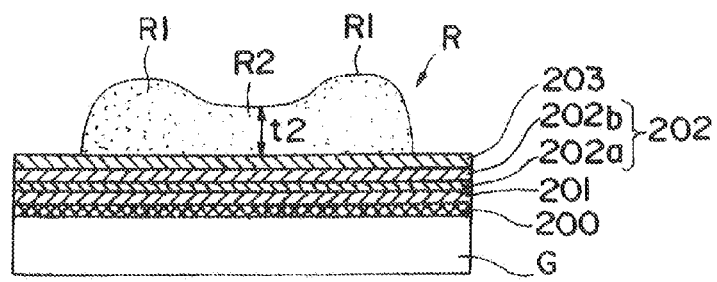
FIG. 11A is a sectional view for explaining a wiring pattern forming process using half exposure processing when the resist film thickness is larger than that in the case of FIG. 10A, illustrating an appearance that a resist pattern is formed on a metal layer.
Figure 11B:
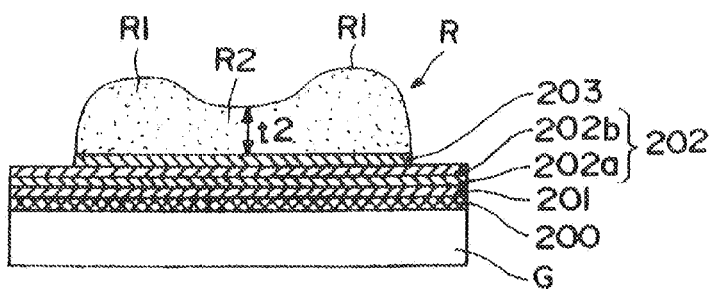
FIG. 11B illustrates an appearance that the metal layer is etched using the resist pattern as a mask in FIG. 11A.
Figure 11C:
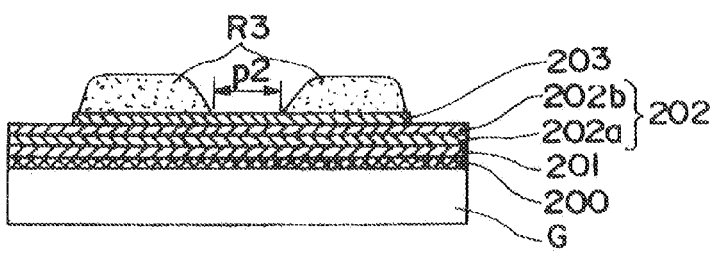
FIG. 11C illustrates an appearance that the film thickness of the resist pattern is reduced in FIG. 11B.
Figure 11D:
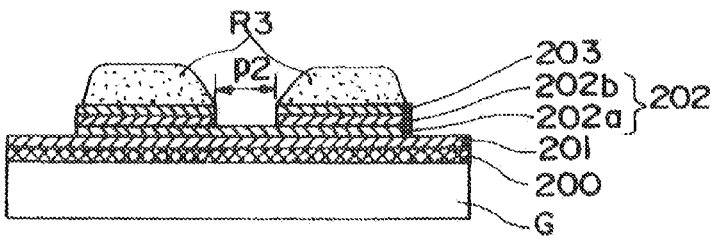
FIG. 11D illustrates an appearance that the metal layer and a Si layer are etched using the resist pattern as a mask in FIG. 11C.
Figure 11E:
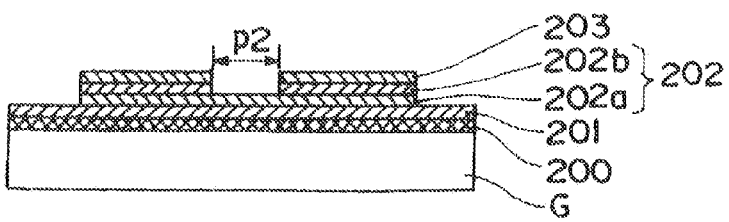
FIG. 11E illustrates an appearance that the resist pattern is removed in FIG. 11D.

More specifically, as schematically illustrated in FIG. 9, since the required illuminance in each large block B1 is set in the recipe, the forward current corresponding to the required illuminance is supplied to each light emission control group GR at a timing when each large block B1 on the substrate G passes below each light emission control group GR. For example, in the example of the recipe table T in FIG. 8, a forward current of 7.5 mA is supplied to the light emission control group GR5 at the timing when the large block B1(x2, y1) passes, and a forward current of 4.1 mA is supplied to the light emission control group GR5 at the timing when the large block B1(x3, y1) passes.

Note that with five UV-LED elements L set as a light emission control group GR, each group GR corresponds to one large block B1 in this embodiment as described above.

In the above manner, irradiation is performed at the required illuminances based on the recipe to all of the large blocks B1 when the substrate G passes below the light source 4, with which the local exposure ends.

Note that as illustrated in FIG. 3, the exposure processing to the substrate G ends with the local exposure processing (AE), and the resist film after the exposure is subjected to developing treatment by the developing apparatus 56 (DEV).

According to this embodiment, exposure processing is locally performed to an arbitrary portion which is desired to be reduced in film thickness, as means for correcting exposure processing to the substrate G as described above.

In the local exposure processing, since the correlation data between the illuminances at a plurality of levels and the residual film thicknesses can be obtained in the measurement mode for setting the recipe contents in advance, an optimal required illuminance can be easily set from the target residual film thickness for each large block B1 as a unit of film thickness control.

Accordingly, even when, for example, different film thicknesses (a thick portion and a thin portion) are provided in the resist film in the half exposure processing (namely, even for a small film thickness as in the thin portion), the resist film thickness after developing treatment can be adjusted to be uniform. As a result, variations in line width and pitch of the wiring pattern can be suppressed.

Further, the correlation data is held as a data base, whereby even when the required reduced film thickness (target film thickness) is changed due to a change of the mask pattern, the required illuminance can be easily obtained based on the correlation data.

In the above-described procedure, the optimal required illuminance is obtained for each large block B1 (Step S11 in FIG. 4). Then, it is assumed that the value reaches, for example, the value presented in FIG. 12. Then, irradiation only needs to be performed to each large block B1 at the illuminance presented in FIG. 12.

Next, a second embodiment will be described. Here, description of the same part as in the first embodiment is omitted. In the second embodiment, after the values presented in FIG. 12 are obtained, later-described operation is further performed and control of the illuminances is performed based on the result of the operation.

Figure 12:
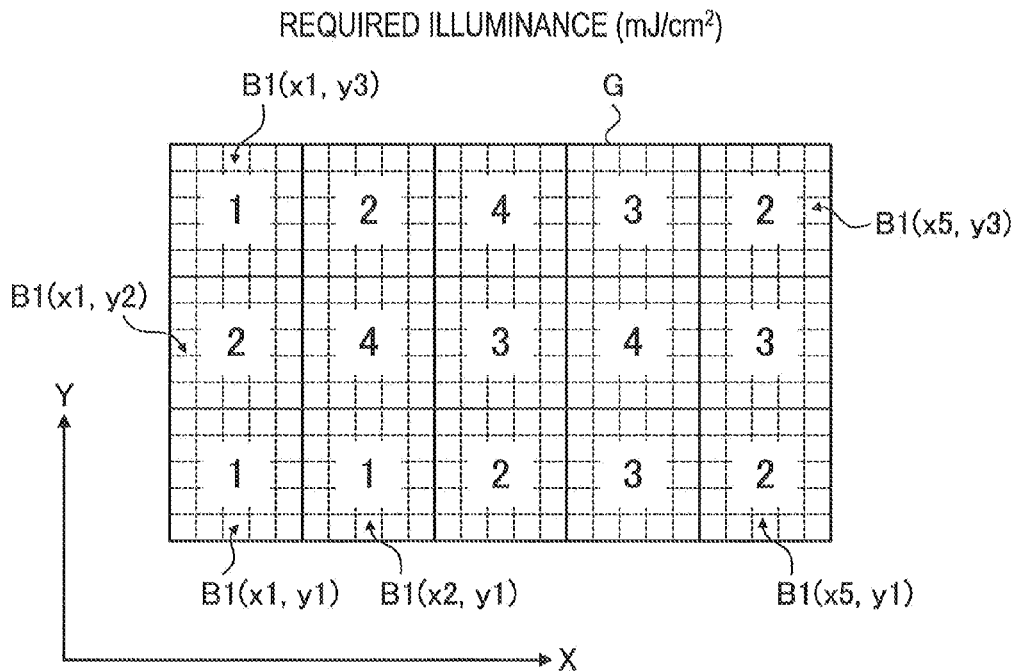
FIG. 12 is a plan view illustrating an example of illuminances assigned to the large blocks.

For easy understanding here, areas of B1(x1, y1), B1(x2, y1), B1(x3, y1), B1(x4, y1), and B1(x5, y1) in FIG. 12 are used for description. A graph made by plotting the positions in the X-direction of B1(x1, y1) to B1(x5, y1) on the horizontal axis and the illuminance for each large block B1 on the longitudinal axis is FIG. 13.

Figure 13:
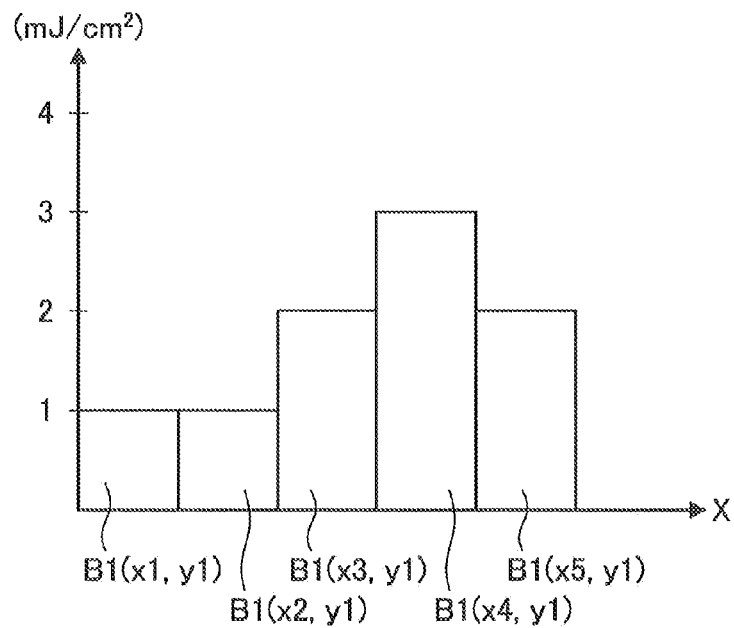
FIG. 13 is a graph illustrating an example of illuminances assigned to the large blocks.
Figure 14:
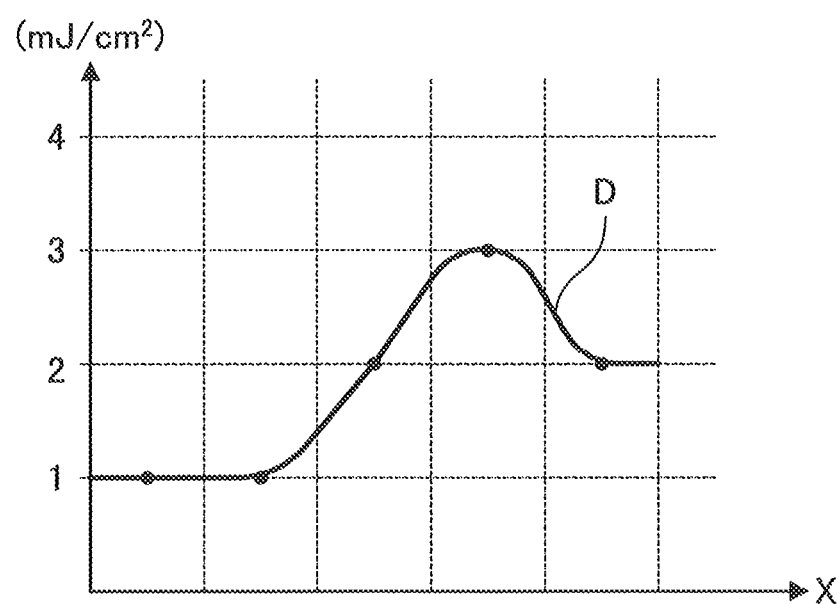
FIG. 14 is an explanatory diagram of an interpolation operation in a second embodiment.

In the first embodiment, irradiation is performed at the setting of the illuminance for each large block B1 illustrated in FIG. 12, FIG. 13. However, the illuminance varies in a step-like manner (for example, from 1 mmJ/cm² to 2 mmJ/cm²) at the boundary portion between B1(x2, y1) and B1(x3, y1). Hence, to smoothly vary the illuminance at the boundary portion, an interpolation operation is performed between B1(x1, y1) to B1(x5, y1) as illustrated in FIG. 14.

For example, the required illuminance for a large block B1(xn, y1) is plotted at the middle in the X-direction of the large block B1(xn, y1), and a graph D is obtained by smoothly interpolating the plotted points. Then, the illuminance of each small block B2(xn, yn) is independently controlled according to the graph D and irradiation is then performed. Here, when performing the interpolation between B1(x1, y1) to B1(x5, y1), a generally-used interpolation method can be used. Further, a program for performing the interpolation may be stored in advance in the control unit 40 to perform automatic interpolation operation. Similarly, the interpolation operation is performed between the large blocks B1 also in the Y-direction. It is also possible to set the illuminance for each of all the small blocks B2 in this above manner to control each small block B2.

As described above, though the operation and control are more complicated in the second embodiment than in the first embodiment, the resist film thickness can be more accurately adjusted in the second embodiment than in the first embodiment.

Note that an example of making uniform the resist residual film thickness after the half exposure processing is described in the above embodiments, but the local exposure method according to the present invention is applicable not only to the half exposure processing. For example, even when not the half exposure processing but the normal exposure processing is performed, the resist residual film thickness can be made uniform within the plane by applying the local exposure method according to the present invention.

Further, the recipe table may be created in the measurement more based on correlation data which is not limited to the correlation data between the residual film thickness and the illuminance as in the Steps St7, St8 in FIG. 4 obtained by measuring the resist residual film thickness but is the correlation data between the pattern line width and the illuminance obtained by measuring the pattern line width after developing treatment. For example, the illuminance of the irradiation to the small block B2 where the pattern line width reaches the line width consistent with a desired value (target line width) can be regarded as the required illuminance to the large block B1 including the small block B2.

Further, though the above embodiments are described taking the case of performing exposure processing while horizontally transferring the substrate G as an example, the present invention is not limited to those embodiments but may be configured such that a substrate is held standing still in a chamber and exposure processing is performed to the held substrate.

In this case, the line-shaped light source may be moved with respect to the substrate (namely, the line-shaped light source only needs to be configured to relatively move in an opposite direction to that of the substrate).

Further, one UV-LED element L is controlled in light emission to one small block B2 and performs irradiation at each set illuminance in the measurement mode in the above embodiments, but the present invention is not limited to that configuration.

In other words, the size of the minimum light emission control unit in the measurement mode is not limited but, for example, a plurality of UV-LED elements L adjacent to each other may be controlled in light emission to one small block B2 and perform irradiation at the set predetermined illuminance. Furthermore, parts of the above-described embodiments may performed in combination.

In the case where a plurality of UV-LED elements L are controlled in light emission to perform irradiation to one small block B2 as described above, it is necessary to set a small block B2 according to the illumination area of the plurality of UV-LED elements L, so that the number of small blocks B2 set on the substrate surface is reduced as compared to the case where one UV-LED element L corresponds to the small block B2, and the required illuminance to each large block B1 can be obtained in a shorter time.

Note that while the above-described embodiments are examples applied to an FPD substrate for a liquid crystal, a plasma display, an organic EL or the like, the present invention is also applicable to substrates other than the FPD substrate, such as a semiconductor wafer, a mask reticle for a photomask, and a substrate for manufacturing a solar cell.

What is claimed is:

1. A local exposure method of locally performing exposure processing by dividing an undeveloped photosensitive film formed on a substrate into a plurality of large blocks, relatively moving the substrate below a plurality of light emitting elements arranged in a line shape and in a direction intersecting with an arrangement direction of the light emitting elements, and selectively controlling a light emission of the plurality of light emitting elements based on a required large-block illuminance of irradiation obtained in the following steps for each of the large blocks, said local exposure method comprising the steps of:

dividing a large block of the plurality of large blocks into a plurality of small blocks;

setting small-block irradiation illuminances different in a stepwise fashion for the small blocks in the large block respectively;

controlling the light emission of the light emitting elements based on the small-block irradiation illuminances respectively set for the small blocks for the undeveloped photosensitive film on the substrate moving with respect to the plurality of light emitting elements;

developing the undeveloped photosensitive film which has been subjected to exposure processing by irradiation by the light emitting elements, to form a developed photosensitive film;

measuring a residual film thickness of a photosensitive film pattern of the developed photosensitive film at each of the small blocks which have been subjected to the developing step to obtain correlation data between the small-block irradiation illuminances set for the small blocks and the measured residual film thickness at each of the small blocks; and obtaining the required large-block illuminance of irradiation for each of the large blocks from a target residual film thickness set in advance for each of the large blocks based on the correlation data.

2. The local exposure method as set forth in claim 1, further comprising the steps of:

after said step of obtaining the required large-block illuminance of irradiation for each of the large blocks based on the correlation data, relatively moving the substrate with respect to the plurality of light emitting elements; and selectively controlling the light emission of the plurality of light emitting elements based on the required large-block illuminance of irradiation for each of the large blocks, when the plurality of large blocks formed on the substrate are relatively moved below the plurality of light emitting elements.

3. The local exposure method as set forth in claim 1, wherein in said step of controlling the light emission of the light emitting elements based on the small-block irradiation illuminances, one or a plurality of the light emitting elements is controlled to perform irradiation at the small-block irradiation illuminances respectively set for each of the small blocks.

4. The local exposure method as set forth in claim 1, wherein in said step of controlling the light emission of the light emitting elements based on the small-block irradiation illuminances, the light emitted from the light emitting elements is radiated to the undeveloped photosensitive film on the substrate via a light diffusing plate.

5. A local exposure method of locally performing exposure processing by dividing an undeveloped photosensitive film formed on a substrate into a plurality of large blocks, relatively moving the substrate below a plurality of light emitting elements arranged in a line shape and in a direction intersecting with an arrangement direction of the light emitting elements, and selectively controlling a light emission of the plurality of light emitting elements based on a required large-block illuminance of irradiation for each of the large blocks, said local exposure method comprising the steps of:

Dividing a large block of the plurality of large blocks into a plurality of small blocks;

setting small-block irradiation illuminances different in a stepwise fashion for the small blocks in the large block respectively;

controlling the light emission of the light emitting elements based on the small-block irradiation illuminances respectively set for the small blocks for the undeveloped photosensitive film on the substrate moving with respect to the plurality of light emitting elements;

developing the undeveloped photosensitive film which has been subjected to exposure processing by irradiation by the light emitting elements, to form a developed photosensitive film;

measuring a line width of a photosensitive film pattern of the developed photosensitive film at each of the small blocks which have been subjected to the developing step to obtain correlation data between the small-block irradiation illuminances set for the small blocks and the measured line width at each of the small blocks; and obtaining the required large-block illuminance of irradiation for each of the large blocks from a target line width set in advance for each of the large blocks based on the correlation data.

6. The local exposure method as set forth in claim 5, further comprising the steps of:

after said step of obtaining the required large-block illuminance of irradiation for each of the large blocks based on the correlation data, relatively moving the substrate with respect to the plurality of light emitting elements; and selectively controlling the light emission of the plurality of light emitting elements based on the required large-block illuminance of irradiation for each of the large blocks, when the plurality of large blocks formed on the substrate are relatively moved below the plurality of light emitting elements.

7. The local exposure method as set forth in claim 5, wherein in said step of controlling the light emission of the light emitting elements based on the small-block irradiation illuminances, one or a plurality of the light emitting elements is controlled to perform irradiation at the small-block irradiation illuminances respectively set for each of the small blocks.

8. The local exposure method as set forth in claim 5, wherein in said step of controlling the light emission of the light emitting elements based on the small-block irradiation illuminances, the light emitted from the light emitting elements is radiated to the undeveloped photosensitive film on the substrate via a light diffusing plate.

* * * * *